(12) United States Patent
Yamaga et al.

(10) Patent No.: US 7,999,253 B2
(45) Date of Patent: Aug. 16, 2011

(54) ORGANIC TRANSISTOR AND ACTIVE MATRIX DISPLAY

(75) Inventors: Takumi Yamaga, Kanagawa (JP); Ikue Kawashima, Kanagawa (JP); Yoshikazu Akiyama, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 526 days.

(21) Appl. No.: 12/067,657

(22) PCT Filed: Jul. 19, 2007

(86) PCT No.: PCT/JP2007/064625
§ 371 (c)(1),
(2), (4) Date: Mar. 21, 2008

(87) PCT Pub. No.: WO2008/015947
PCT Pub. Date: Feb. 7, 2008

(65) Prior Publication Data
US 2009/0272966 A1  Nov. 5, 2009

(30) Foreign Application Priority Data

Aug. 4, 2006 (JP) .................................. 2006-213405

(51) Int. Cl.
*H01L 51/00* (2006.01)
(52) U.S. Cl. ............ 257/40; 257/E51.001; 257/E27.117
(58) Field of Classification Search .................... 257/40, 257/88, E51.018, E51.007; 438/458, 151, 438/637
See application file for complete search history.

(56) References Cited

U.S. PATENT DOCUMENTS

| 7,166,689 B2 | 1/2007 | Sagisaka et al. |
| 2002/0179901 A1 | 12/2002 | Arai et al. |
| 2003/0222315 A1* | 12/2003 | Amundson et al. ............ 257/368 |
| 2004/0023447 A1 | 2/2004 | Hirakata et al. |
| 2006/0157692 A1* | 7/2006 | Wada et al. .................... 257/40 |
| 2006/0246620 A1 | 11/2006 | Nagayama et al. |
| 2007/0048637 A1 | 3/2007 | Okada et al. |
| 2007/0054212 A1 | 3/2007 | Akiyama et al. |

FOREIGN PATENT DOCUMENTS

| JP | 2002 540591 | 11/2002 |
| JP | 2003 536260 | 12/2003 |
| JP | 2004 141856 | 5/2004 |
| JP | 2004-297011 | * 10/2004 |
| JP | 2006 60113 | 3/2006 |
| KR | 2002-0092242 | 12/2002 |
| KR | 2006-0033724 | 4/2006 |
| WO | 2003 092077 | 11/2003 |

OTHER PUBLICATIONS

U.S. Appl. No. 12/135,423, filed Jun. 9, 2008, Yamaga et al.
Extended European Search Report dated Jan. 17, 2011, in European Patent Application No. 07768478.5 (5 pages).

* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

An organic transistor is disclosed that has an organic semiconductor layer patterned with high resolution. The organic transistor includes a gate electrode, a gate insulating film, a source electrode, a drain electrode, and an organic semiconductor layer formed of an organic semiconductor material. The gate electrode, the gate insulating film, the source electrode, the drain electrode, and the organic semiconductor layer are formed on a substrate. At least one of the source electrode and the drain electrode has an opening.

11 Claims, 8 Drawing Sheets

ORGANIC TRANSISTOR AND ACTIVE MATRIX DISPLAY

TECHNICAL FIELD

The present invention relates to an organic transistor and an active matrix display.

BACKGROUND ART

An organic transistor has many advantages, for example, the organic transistor has high flexibility in constituent materials, fabrication methods, and product form; the organic transistor can be formed to have a large area; the organic transistor has a simple laminated structure thereby simplifying the fabrication process; further, the organic transistor can be formed by using inexpensive fabrication devices. Moreover, as thin films or circuits can be fabricated easily by printing, spin-coating, or dipping, fabrication cost is low compared to a Si-based semiconductor transistor.

When integrating the organic transistors, it is necessary to pattern an organic semiconductor layer. If the organic transistors are integrated with the organic semiconductor layer not patterned, during operation of the organic transistors, an off current increases and power consumption rises. In addition, the large off current also causes cross-talk when pixels are being processed for displaying.

In the Si-based semiconductor transistors, the patterning is performed by photolithography and etching. For the organic transistors, it is noted that inkjet printing and printing by using a dispenser are promising candidates.

For example, Japanese Laid Open Patent Application No. 2004-297011 (below, referred to as "reference 1") discloses a method of fabricating an organic transistor by appropriately combining the following techniques, specifically, a technique of applying a charge at a specified position onto a surface to be plated, applying a charge of an opposite polarity onto a coating material, and then directing the coating material to the specified position by Coulomb force; a technique of forming a depression at a specified position on a surface to be plated, and applying a coating material to bury the depression; and a technique of evaporating a solvent after applying a coating material to form a pattern, and irradiating a laser beam onto the pattern to shape the pattern.

Further, Japanese Laid Open Patent Application No. 2004-141856 (below, referred to as "reference 2") discloses a method of forming an indented region on a surface of a substrate, and depositing a liquid material on a specified region adjacent to the indented region for patterning.

In this case, similar to the Si-based semiconductor materials, a photo-resist is applied, and the substrate is exposed and developed to have a desired pattern, thus forming a resist pattern; then etching is performed with this resist pattern as an etching mask, then, the resist is removed. In this way, the organic semiconductor layer can be patterned. However, when a polymer semiconductor material is used, if a photo-resist is applied onto the organic semiconductor layer for patterning, the performance of the transistor is likely to be degraded. This is because the photo-resist is formed from a solution, which is prepared by dissolving a novolac resin having a naphthoquinone-diazide photo-sensitive group into an organic solvent (such as dimethylbenzene, and cellosolve solutions), and the polymer semiconductor material may be adversely influenced by the organic solvent included in the photo resist.

When pentacene or other crystalline molecules are used as the organic semiconductor material, after photolithography, the performance of the transistor may be degraded, although the degradation level depends on specific situations. Further, when stripping the resist after photolithography, the organic semiconductor material may be damaged by the stripping solution (for example, ethylene glycol monobutyl ether, ethylene glycol monoethanolamine, and others), or be damaged by pure water rinse after stripping.

On the other hand, in a printing technique, since a pattern is written directly, material utilization efficiency can be improved greatly. For this reason, with the organic semiconductor layer patterned by printing, it is possible to simplify the fabrication process, improve yield, and reduce fabrication cost. In addition, since a polymer semiconductor solution can be prepared with a polymer semiconductor material soluble to an organic solvent as an organic semiconductor ink, it is possible to pattern the organic semiconductor layer by printing.

However, considering the available precision of printing, it is difficult to form patterns having a dimension less than 50 µm; hence, it is difficult to perform patterning with a high resolution compared to lithography.

In order to solve this problem, it is proposed to reduce the size of liquid drops in printing. However, this is technically difficult, and is anticipated to have limited effects considering stability, ejection clogging, ejection deflection, and so on. Therefore, in order to further improve the patterning resolution, especially the patterning resolution of the organic semiconductor layer, it is necessary to improve the precision of the printing technique.

Japanese Laid Open Patent Application No. 2006-060113 (below, referred to as "reference 3") discloses a method of forming source/drain electrodes, which method involves an inkjet patterning technique by utilizing a difference of surface energies. Specifically, the surface of a substrate is patterned into a high-surface-energy portion and a low-surface-energy portion, and an electrode is arranged only on the high-surface-energy portion by inkjet printing. By this technique, it is possible to perform patterning with precision of a few µm.

Concerning fabrication of the organic transistor, the following problems should be solved. In an organic transistor including a gate electrode formed by inkjet printing by using Ag ink, considering the precision of printing, the size of the gate electrode cannot be reduced too much. Thus, overlapping of the gate electrode and source and drain electrodes is large, and it strongly influences parasitic capacitance. In addition, compared to a transistor formed of Si-based semiconductor materials, generally, an organic transistor has low mobility and a cutoff frequency is very low, namely, in a low-speed operation driving mode. For this reason, in order to drive the organic transistor to operate in a high speed, it is necessary to improve the mobility or modify the structure of the device. Further, since the gate electrode formed by inkjet printing has low surface flatness, defects occur easily in the gate insulating film, and this reduces the yield. Hence, it is difficult to form a large-area and uniform gate insulating film, and it is difficult to obtain insulating performance as expected.

DISCLOSURE OF THE INVENTION

The present invention may solve one or more of problems of the related art.

A preferred embodiment of the present invention may provide an organic transistor having an organic semiconductor layer patterned with high resolution, and an active matrix display having the organic transistor.

According to a first aspect of the present invention, there is provided an organic transistor, comprising:
 a gate electrode;
 a gate insulating film;
 a source electrode;
 a drain electrode; and
 an organic semiconductor layer formed of an organic semiconductor material,
 wherein
 the gate electrode, the gate insulating film, the source electrode, the drain electrode, and the organic semiconductor layer are formed on a substrate, and
 at least one of the source electrode and the drain electrode has an opening.

As an embodiment, the source electrode and the drain electrode are formed on the gate insulating film, and
 a bottom surface of the opening is a surface of the gate insulating film.

As an embodiment, the source electrode and the drain electrode are formed on the gate insulating film, and
 the organic semiconductor layer is formed by a printing step on the gate insulating film in a region including a portion of the opening.

Preferably, the printing step includes one of inkjet printing and dispensing.

As an embodiment, the organic semiconductor material is soluble to an organic solvent.

As an embodiment, the source electrode and the drain electrode are formed in a region of the gate insulating film having increased surface energy.

Preferably, the surface energy of the gate insulating film is increased by irradiation of ultra-violet rays.

As an embodiment, the gate insulating film includes a polymer material.

Preferably, the polymer material includes polyimide.

According to a second aspect of the present invention, there is provided an active matrix display, comprising:
 one or more organic transistors,
 wherein
 each of the organic transistors includes a gate electrode;
 a gate insulating film;
 a source electrode;
 a drain electrode; and
 an organic semiconductor layer formed of an organic semiconductor material,
 wherein
 the gate electrode, the gate insulating film, the source electrode, the drain electrode, and the organic semiconductor layer are formed on a substrate, and
 at least one of the source electrode and the drain electrode has an opening.

According to the present invention, it is possible to provide an organic transistor having an organic semiconductor layer patterned with high resolution, and an active matrix display having the organic transistor.

These and other objects, features, and advantages of the present invention will become more apparent from the following detailed description of preferred embodiments given with reference to the accompanying drawings.

BEST MODE FOR CARRYING OUT THE INVENTION

Below, preferred embodiments of the present invention are explained with reference to the accompanying drawings.

An organic transistor of the present invention includes a gate electrode, a gate insulating film, a source electrode, a drain electrode, and an organic semiconductor layer formed from an organic semiconductor material. The gate electrode, the gate insulating film, the source electrode, the drain electrode, and the organic semiconductor layer are formed on a substrate, and at least one of the source electrode and the drain electrode has an opening. Due to such a structure, it is possible to pattern the organic semiconductor layer with high resolution. Preferably, the source electrode and the drain electrode are formed on the gate insulating film, and the organic semiconductor layer is formed by a printing step on the gate insulating film in a region including a portion of the opening.

Note that a protection film (as described below) may be formed on the surface of the organic transistor of the present invention.

Figure 1:
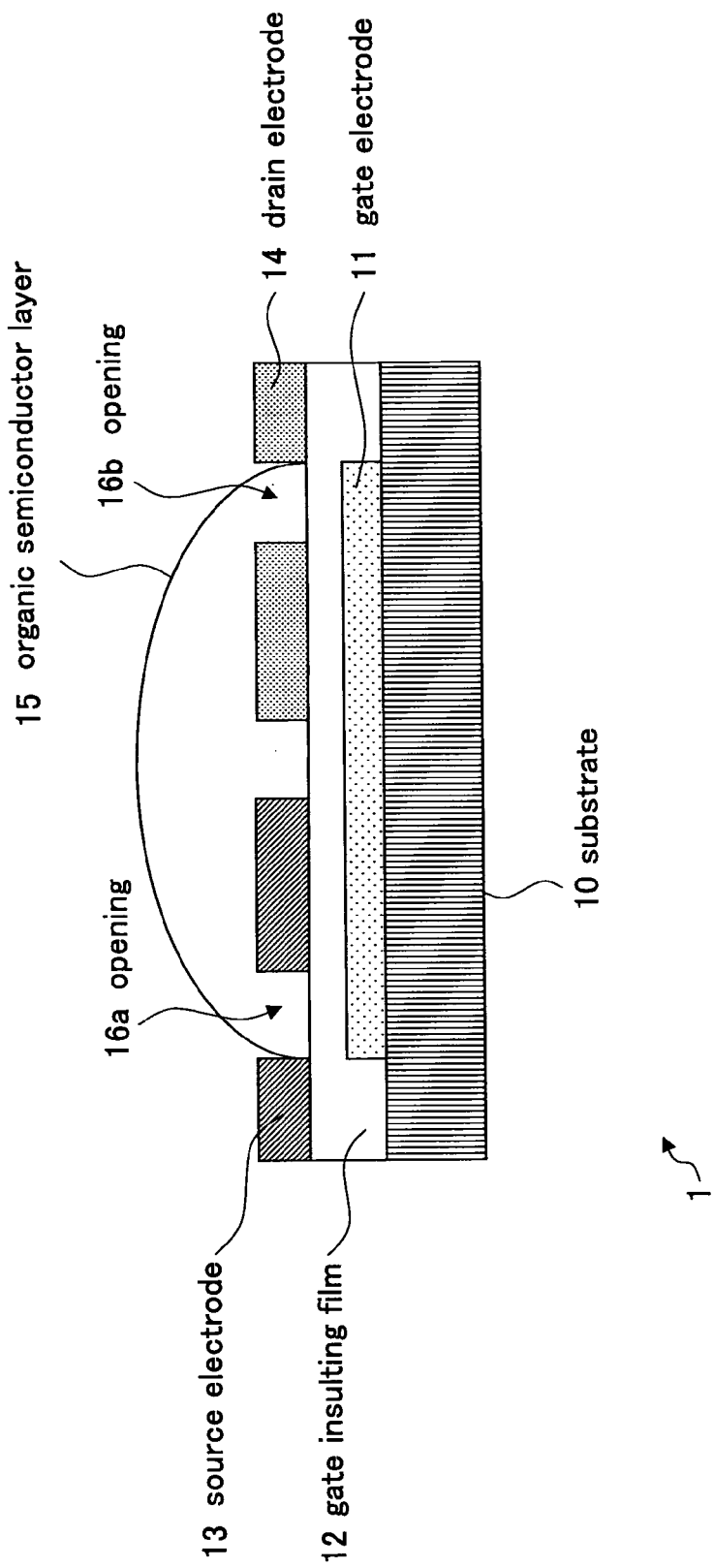
FIG. 1 is a cross-sectional view illustrating an example of an organic transistor 1 according to an embodiment of the present invention.

FIG. 1 is a cross-sectional view illustrating an example of an organic transistor 1 according to an embodiment of the present invention.

As shown in FIG. 1, the organic transistor 1 of the present embodiment includes a substrate 10, a gate electrode 11, a gate insulating film 12, a source electrode 13, a drain electrode 14, and an organic semiconductor layer 15. The gate electrode 11, the gate insulating film 12, the source electrode 13, the drain electrode 14, and the organic semiconductor layer 15 are formed on the substrate 10.

The source electrode 13 and the drain electrode 14 are formed on the gate insulating film 12, the source electrode 13 has an opening 16a, and the drain electrode 14 has an opening 16b.

The organic semiconductor layer 15 is disposed between the opening 16a and the opening 16b. For example, the organic semiconductor layer 15 is formed of an organic semiconductor material.

In the present embodiment, when forming the organic semiconductor layer 15, it is preferable to perform patterning directly; thus it is preferable to form the organic semiconductor layer 15 by printing, such as inkjet printing, and dispensing.

In addition, in order to apply these printing techniques, it is necessary to prepare organic semiconductor ink by dissolving an organic semiconductor material into an organic solvent. In the present embodiment, there is no limitation to the organic semiconductor material soluble in the organic solvent; for example, use can be made of polymers, oligomers, or low molecular materials, which have a functional group soluble in an organic solvent. For example, a chemical compound expressed by the following chemical formula can be used as the organic semiconductor material.

Figure 4:
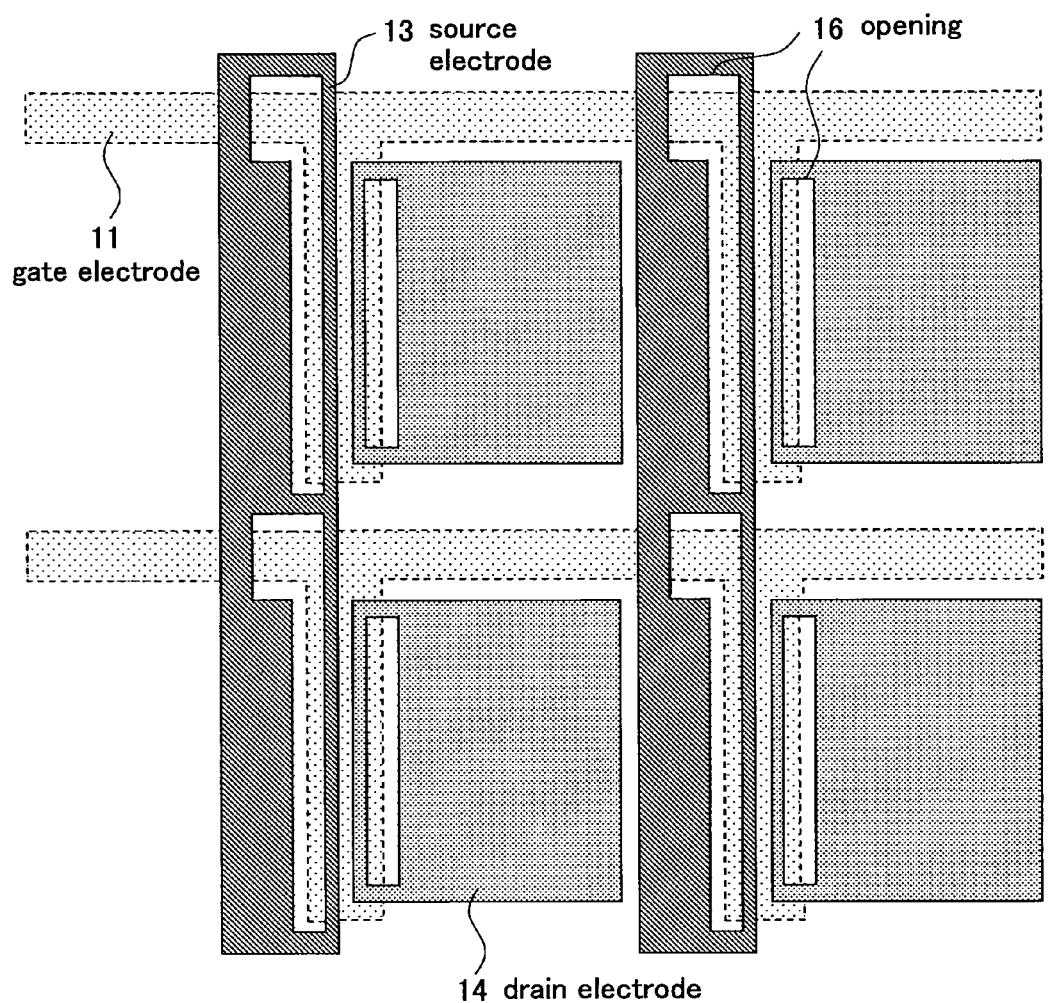
FIG. 4 is a schematic view illustrating a configuration of source and drain electrodes according to the present embodiment.

It should be noted that there is no limitation to the shape of the openings 16a and 16b; in addition to the shapes shown in FIG. 4, the openings 16a and 16b may be triangles, squares, diamonds, rhombuses, or any other shapes.

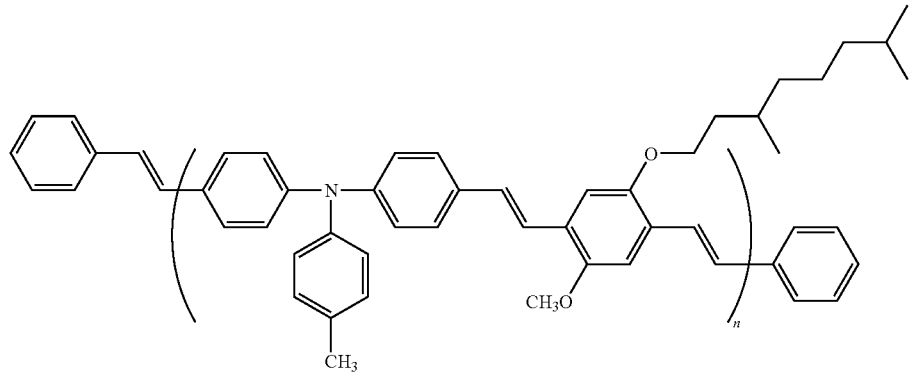

This chemical compound is a random-oriented polymer, despite film shapes and methods of forming the film, fluctuations of transistor performance are small.

Figure 2:
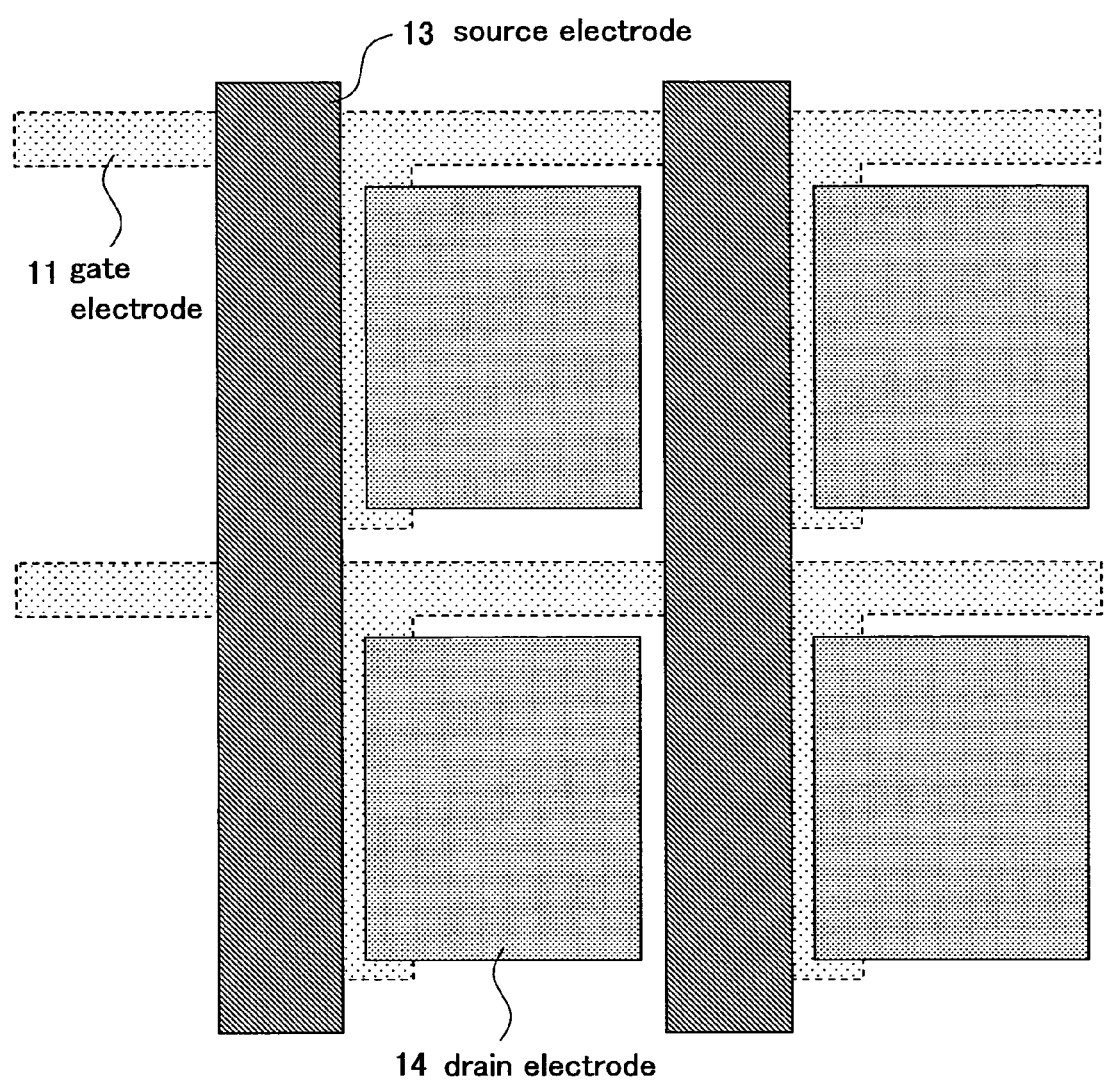
FIG. 2 is a schematic view illustrating a configuration of common source and drain electrodes.

FIG. 2 is a schematic view illustrating a configuration of common source and drain electrodes.

As shown in FIG. 2, generally, for common source and drain electrodes, even when organic semiconductor ink is printed by a printing process, it is difficult to perform patterning with a high resolution.

Figure 3:
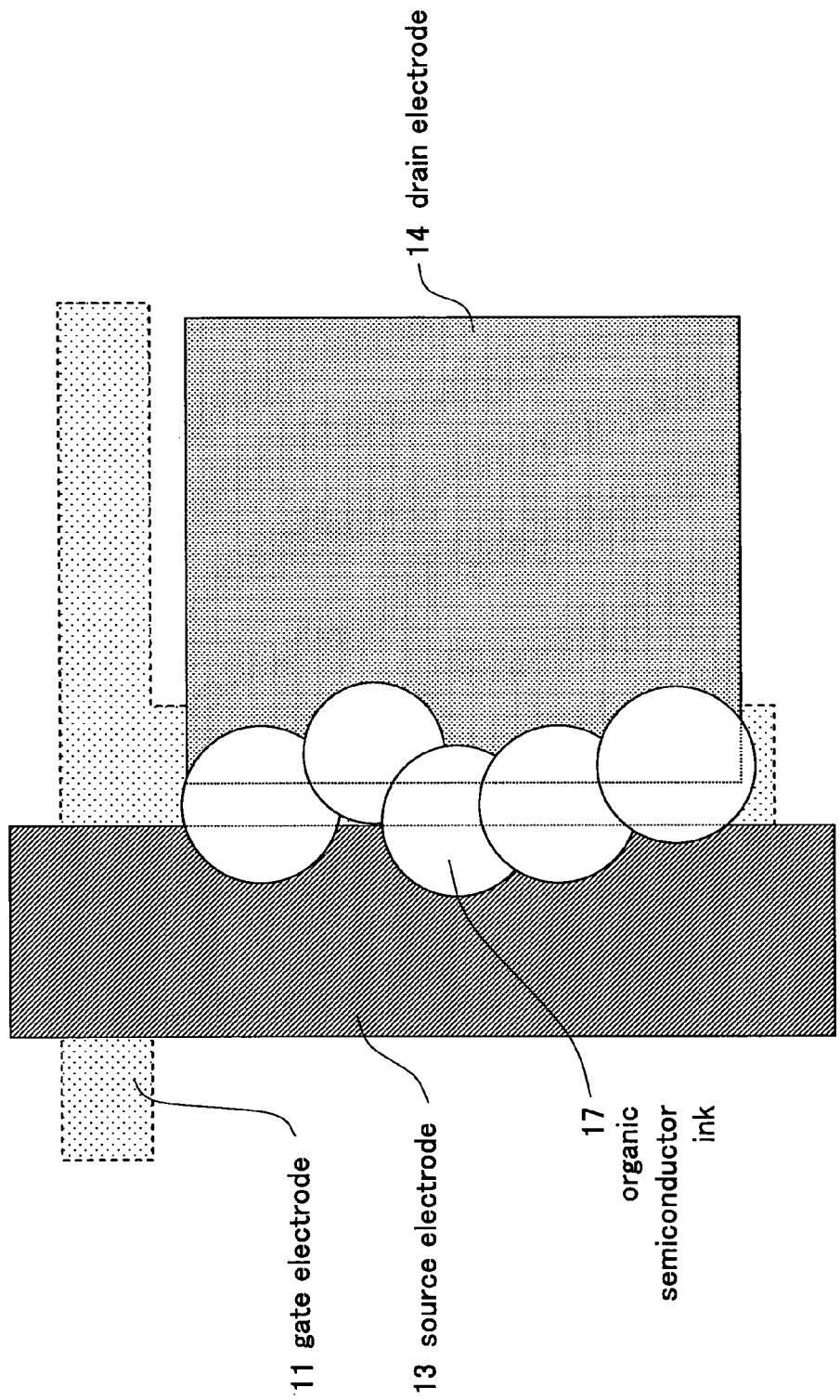
FIG. 3 is a schematic view illustrating formation of an organic semiconductor layer on the source electrode and drain electrode in FIG. 2.

FIG. 3 is a schematic view illustrating formation of an organic semiconductor layer on the source electrode and drain electrode in FIG. 2.

As shown in FIG. 3, since it is difficult to perform patterning with high resolution, it is necessary to keep large alignment margins.

This is because the ejected ink droplet position precision, including extent of expansion of ejected organic semiconductor ink droplet, is low. In addition, since the organic semiconductor ink is liable to expand on a source/drain electrode having high surface energy, the organic semiconductor layer may become very thin, or the organic semiconductor layer may have a coffee stain shape, it is difficult to form a film of a uniform thickness, or a continuous film. Further, since fluctuations of ejection speed, which are caused by defects like ejection deflection or solution degeneration, are large, it is difficult to perform patterning with high resolution.

In order to solve this problem, in the present embodiment, the opening 16a and the opening 16b are formed in the source electrode 13 and the drain electrode 14, respectively.

FIG. 4 is a schematic view illustrating a configuration of source and drain electrodes according to the present embodiment.

As shown in FIG. 4, the openings 16a and 16b (collectively referred to as "openings 16" where necessary) are formed in the source electrode 13 and the drain electrode 14. Due to presence of the openings 16, expansion of the organic semiconductor ink droplet is restricted.

Further, as shown in FIG. 1, since the gate insulating film 12, which has low surface energy, is on the bottom of the openings 16a and 16b, the organic semiconductor ink can be repelled easily, and this further restricts expansion of the organic semiconductor ink droplet.

In this way, because of the depth of the openings 16a and 16b and the surface energy of the gate insulating film 12, it is possible to perform patterning with high resolution.

Figure 5:
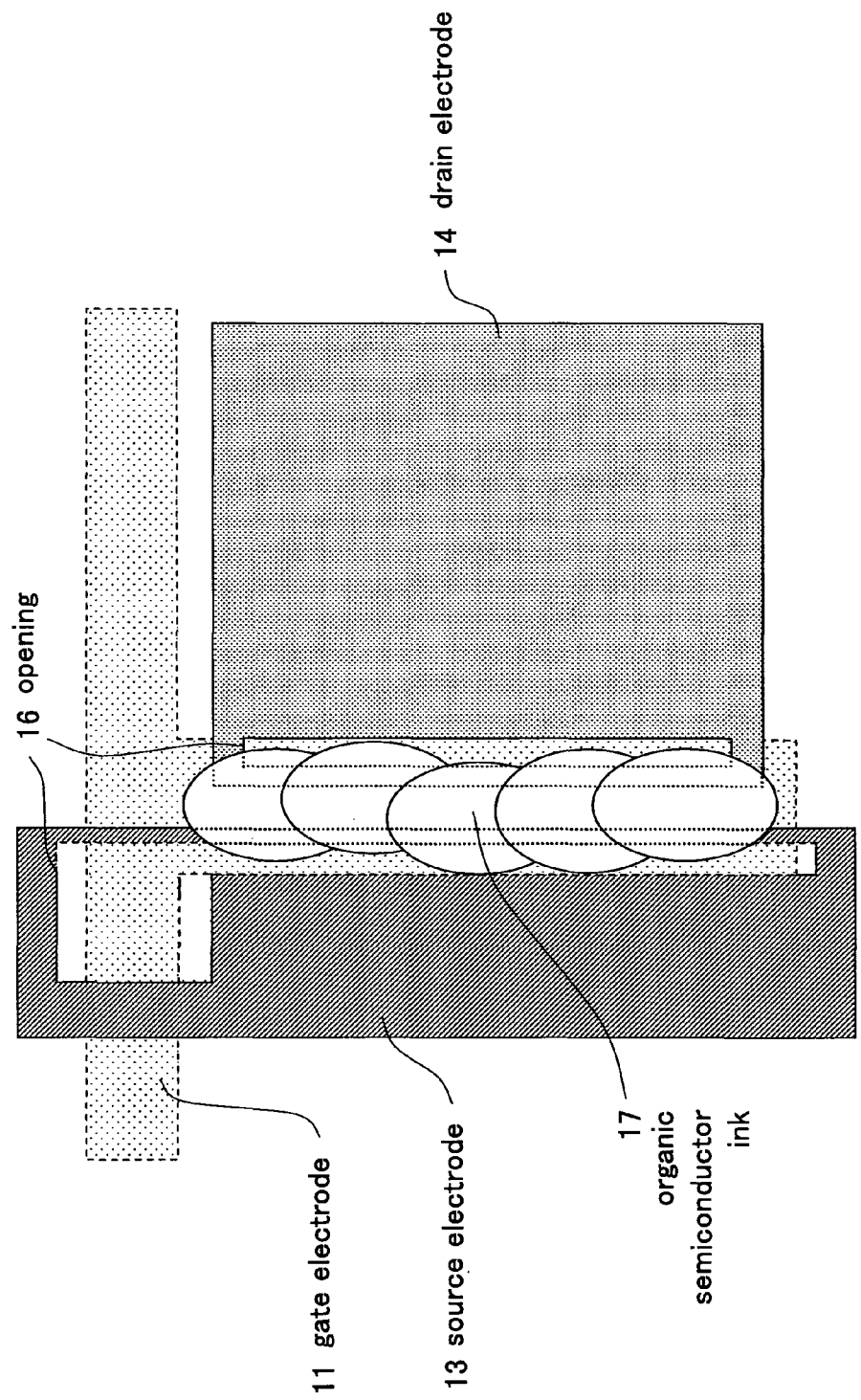
FIG. 5 is a schematic view illustrating formation of the organic semiconductor layer 15 on the source electrode 13 and drain electrode 14 shown in FIG. 4.

FIG. 5 is a schematic view illustrating formation of the organic semiconductor layer 15 on the source electrode 13 and drain electrode 14 shown in FIG. 4.

As shown in FIG. 5, the organic semiconductor ink droplets, which are ejected onto a channel region between the source electrode 13 and drain electrode 14 facing each other, start to expand at the ejection position, but the expansion is stopped by the openings 16 in the source electrode 13 and the drain electrode 14. Therefore, precision of ejection of the organic semiconductor ink is determined by the interval between the opening 16a of the source electrode 13 and the opening 16b of the drain electrode 14. Further, since it is possible to control the expansion of the organic semiconductor ink, it is easy to form a film of a uniform thickness or a continuous film. Thus, it is possible to reduce the concentration of the organic semiconductor ink, and reduce the quantity of the organic semiconductor ink for use.

As described above, in the present embodiment, the openings 16 are formed in the source electrode 13 and the drain electrode 14. If depressions are formed instead of the openings 16, the effect of restricting expansion of the organic semiconductor ink droplet is weak compared to the present embodiment. Further, in the present embodiment, since the gate insulating film 12, which has low surface energy, exists on the bottom of the openings 16a and 16b, the effect of restricting expansion of the organic semiconductor ink droplet is further strengthened. As a result, the printing precision is improved, and it is possible to pattern the organic semiconductor layer with high resolution by printing. In addition, overlap of the gate electrode 11 and source and drain electrodes 13, 14 is small, and thus insufficient insulation can be avoided, and a high-speed transistor can be realized.

In the present embodiment, when forming the gate electrode 11, the source electrode 13, and the drain electrode 14, it is preferable to use metal ink obtained by dispersing metal particles. For example, the metal particles may include one or more of Au, Ag, Cu, Pt, Pd, Ni, Ir, Rh, Co, Fe, Mn, Cr, Zn, Mo, W, Ru, In, and Sn. Particularly, it is preferable to use Au, Ag, Cu, and Ni from the point of view of electrical resistance, thermal conductivity, and corrosion.

The metal ink can be prepared by dispersing metal particles, each having an average diameter in a range from several nm to several tens nm, into a solvent uniformly. As is well-known, the metal particles can be sintered at a very low temperature. This is because when the diameter of the metal particles becomes small, metal atoms near a surface having high activity become more important, and have large influence. If the above-described metal ink is printed by inkjet printing, dispensing, or other printing techniques, and is then sintered, it is possible to directly write patterns on the source electrode 13 and the drain electrode 14.

In this case, in order to print the metal ink by printing, solid state properties of the metal ink should be considered. For example, if the surface tension or viscosity is not appropriate, ink droplets cannot be ejected or are ejected with defects; for example, the ink droplets are not circular, and ligaments become long. To solve these problems, it is preferable to set the surface tension of the metal ink to be about 30 mN/m, and the viscosity of the metal ink to be about 2 to 13 mPa·sec, and more preferably, in a range from 7 to 10 mPa·sec. Further, it is necessary for the metal ink to have an appropriate drying property such that when ejecting the metal ink, the solvent is vaporized and the metal particles aggregate without solidification.

Preferably, the source electrode 13 and the drain electrode 14 are formed from conductive polymers, for example, the conductive polymers may be polymers like polythiofuran, polyaniline, polypyrrole, poly (p-phenylene), and poly acetylene, or doped polymers. Particularly, it is preferable to use a complex of poly-ethylenedioxythiofuran (PEDOT) and poly-styrene sulfonic acid (PSS) (this complex is denoted as PEDOT/PSS), because of its good electrical conductivity, stability, and heat resistance. Although the conductive polymer is inferior to metals in electrical properties and stability, the conductive polymer has the following advantages, that is, its electrical properties can be improved by its polymerization grade and structure, and as sintering is not needed, a conductive polymer film can be formed at a low temperature.

In the present embodiment, it is preferable that the gate insulting film 12 include polymer materials like polyimide, polyvinyl alcohol, polyvinyl phenol, or polyparaxylylene. With such a gate insulting film 12, it is possible to increase the surface energy of the gate insulting film 12 by irradiating ultra-violet rays onto the gate insulting film 12. Consequently, it is possible to directly write patterns, by printing and with a high resolution, on the source electrode 13 and the drain electrode 14 in regions of the gate insulting film 12 having increased surface energy. Furthermore, by using polyimide, which has low surface energy, it is possible to pattern the organic semiconductor layer 15 with high resolution. Reference 3 discloses some polymer materials, the surface energy of which can be increased by being irradiated with ultra-violet rays.

When forming the source electrode 13 and the drain electrode 14, shadow masks and photo resists can be used.

In the present embodiment, the substrate 10 may be a glass substrate or a film substrate.

The organic transistor 1 of the present embodiment can be fabricated as below.

As shown in FIG. 1, for example, Ag ink, which is obtained by dispersing Ag particles, is printed on the substrate 10 by inkjet printing, thereby forming the gate electrode 11. Then, polyimide is applied on the gate electrode 11 by spin-coating to form the gate insulting film 12. Next, the gate insulting film 12 is irradiated with ultra-violet rays via a photo-mask to form a pattern, which is used to form the source electrode 13 and the drain electrode 14 having the openings 16a, 16b.

For example, Ag ink, which is obtained by dispersing Ag particles, is printed on the pattern by inkjet printing, thereby forming the source electrode 13 and the drain electrode 14. Finally, organic semiconductor ink is printed, by inkjet printing, between the opening 16a and the opening 16b of the source electrode 13 and the drain electrode 14 to form the organic semiconductor layer 15.

It is well known that the operation of a field effect transistor can be described by the following formula.

$$I_{ds}=W/2L*\mu*C_i*(V_g-V_{th})^2 C_i=\in_0\in_r S/t,$$

where,
$I_{ds}$ represents a drain current,
W represents a channel width,
L represents a channel length,
μ represents mobility,
$C_i$ represents a static capacitance of the gate insulting film 12,
$V_g$ represents a gate voltage,
$V_{th}$ represents a threshold voltage,
$\in_0$ represents the dielectric constant of a vacuum,
$\in_r$ represents a specific dielectric constant of the gate insulting film 12,
S represents an area of the source electrode 13 and drain electrode 14, which face each other, and
t represents a thickness of the gate insulting film 12.

The above formula reveals that in order to increase the drain current $I_{ds}$, it is sufficient to increase the static capacitance $C_i$ of the gate insulting film 12, and the static capacitance $C_i$ of the gate insulting film 12 can be increased by increasing the specific dielectric constant $\in_r$ of the gate insulting film 12, by increasing the area S of the source electrode 13 and drain electrode 14, or by decreasing the thickness t of the gate insulting film 12. It should be noted that the specific dielectric constant $\in_r$ of the gate insulting film 12 depends on the material of the gate insulting film 12, and the area S of the source electrode 13 and drain electrode 14 is limited by pixel size.

In the present embodiment, since the source electrode 13 and the drain electrode 14 have the openings 16a, 16b, overlapping of the gate electrode 11 and source and drain electrodes 13, 14 is small; this can reduce the gate leakage current, and reduce the thickness of the gate insulting film 12. In other words, the thickness t of the gate insulting film 12 can be reduced. Consequently, in the present embodiment, the drain current $I_{ds}$ can be increased.

Generally, when forming the gate electrode 11 by printing with the metal ink, usually, due to the influence of the coffee stain phenomenon, it is difficult to make the surface of the gate electrode 11 flat; specifically, projections appear at ends of the gate electrode 11. Further, if the gate insulting film 12 is formed on such a gate electrode, the thickness of the gate insulting film on the projections is small, and this may cause insufficient insulation.

To solve this problem, in the organic transistor 1 of the present embodiment, since the source electrode 13 and the drain electrode 14 have the openings 16a, 16b, an electrical field is not applied on the insulting film disposed on the projections of the gate electrode 11. Due to this, it is possible to greatly reduce initial defects of the gate insulting film 12, and sufficient insulating performance is obtainable despite the presence of unevenness of the gate electrode 11. Therefore, the organic transistor 1 of the present embodiment can be fabricated with high yield, and it is possible to prevent insufficient insulation caused by influence of particles.

It is well known that the cutoff frequency of a field effect transistor can be described by the following formula.

$$f_c=\mu*V_{ds}/2\pi/L(L+D)$$

where,
$f_c$ represents a cutoff frequency,
μ represents mobility, $V_{ds}$ represents a drain voltage, L represents a channel length, D represents an overlapping length with the gate electrode 11.

The above formula reveals that in order to increase the cutoff frequency $f_c$, it is sufficient to reduce D, namely, the overlapping length with the gate electrode 11. In other words, if the parasitic capacitance is small, the field effect transistor can work at high speed.

In the organic transistor 1 of the present embodiment, since the source electrode 13 and the drain electrode 14 have the openings 16a, 16b, the overlapping length D can be made small; thus the organic transistor 1 of the present embodiment is capable of operation at high speed.

Below, an active matrix display according to the present embodiment is described.

The active matrix display of the present embodiment uses the organic transistors 1 of the present embodiment as active elements, and the active elements are combined with pixel display elements.

As the organic transistor 1 of the present embodiment is used in the active matrix display of the present embodiment, it is possible to obtain an inexpensive display panel superior in flexibility. When fabricating the organic transistor 1, since high resolution patterns of the organic semiconductor layer 15 can be directly written by printing, it is possible to simplify the fabrication process, improve the yield, and reduce fabrication cost.

The active matrix display of the present embodiment can be fabricated as below.

As shown in FIG. 4 and FIG. 1, for example, Ag ink, which is obtained by dispersing Ag particles, is printed on the substrate 10 by inkjet printing, thereby, forming the gate electrode 11 (scanning lines). Then polyimide is applied on the gate electrode 11 by spin-coating to form the gate insulting film 12. Next, the gate insulating film 12 is irradiated with ultra-violet rays via a photo-mask to form a pattern, which is used to form the source electrode 13 and the drain electrode 14 having the openings 16a, 16b. Then, for example, Ag ink, which is obtained by dispersing Ag particles, is printed on the pattern by inkjet printing, thereby forming the source electrode 13 and the drain electrode 14 (signal lines). Further, organic semiconductor ink is printed, by inkjet printing, between the opening 16a and the opening 16b of the source electrode 13 and the drain electrode 14 to form the organic semiconductor layer 15. Finally, a polyparaxylylene (parylene C) film (not illustrated) is deposited by CVD to a thickness of 2000 nm, which serves as a protection layer. Thereby, an organic transistor substrate is obtained.

Polyparaxylylene may include parylene C, parylene, and parylene F. Polyparaxylylene is characterized by superior permeability in water vapor and gas compared to other organic materials; in addition, a polyparaxylylene film can be formed at room temperature with good step coverage; the polyparaxylylene is superior in electrical performance; and the polyparaxylylene is resistive to organic solutions, acids, and alkali.

Parylene C has a volume resistivity higher than $10^{16} \Omega \cdot cm$, and a dielectric breakdown voltage higher than 2 MV/cm. Further, parylene C is superior in dielectric properties, has low dielectric loss (0.020 (60 Hz), 0.019 (1 kHz), 0.013 (1 MHz)).

Next an ITO (Indium Tin Oxide) film is deposited on an opposite substrate by sputtering to a thickness of about 100 nm, then polyimide is applied on the ITO film and is rubbed to form an alignment film having a thickness of about 200 nm. After alignment treatment the opposite substrate is bonded with the organic transistor substrate via silica spacer, then a liquid crystal material is sealed in the gap between the two substrates. In this way, a liquid crystal panel is obtained.

Instead, if microcapsule electrophoresis elements instead of the liquid crystal material are sealed, an electrophoresis panel is obtained. Further, if the pixel elements are organic EL (Electroluminescence) elements, by disposing an air shielding material, an organic EL panel is obtained.

Below, examples of the present invention are described. It should be noted that the present invention is not limited to the examples.

EXAMPLE 1

Ag ink obtained by dispersing Ag particles is printed on a glass substrate by inkjet printing, and is sintered at 280° C., thereby, forming a gate electrode which is 100 nm in thickness and is 100 μm in line width.

Then, polyimide is applied on the gate electrode by spin-coating, and is then heated at 280° C. to form a gate insulting film having a thickness of 400 nm.

Next, a UV lamp is used to irradiate ultra-violet rays at a dose of 7 J/cm² onto the gate insulting film via a photo-mask, thereby forming a pattern having openings and of high surface energy.

Then, Ag ink obtained by dispersing Ag particles is printed on the pattern by inkjet printing and is sintered at 280° C., thereby forming a source electrode and a drain electrode. Here, the channel length (the distance between the source electrode and the drain electrode) is 5 μm.

Next, organic semiconductor ink is printed, by inkjet printing, between the openings of the source electrode and the drain electrode, thereby forming an organic semiconductor layer.

In this way, an organic transistor as shown in FIG. 1 is fabricated.

Here, the organic semiconductor is a random-oriented polymer as expressed by the above-mentioned chemical formula.

COMPARISON EXAMPLE 1

Instead of forming a pattern having openings and of high surface energy as shown in example 1, here, a pattern without openings but of high surface energy is formed. Except for this, an organic transistor is fabricated in the same way same as that in example 1.

Evaluation Method and Evaluation Results

Static performance of the organic transistors of the example 1 and the comparison example 1 is evaluated by using a semiconductor parameter analyzer 4145B (manufactured by HP Co.). When evaluating the static performance of the organic transistors, a drain voltage $V_{ds}=-20V$ is applied, and a gate voltage $V_g$ is varied from 20 V to −20 V each time by 0.5 V.

Figure 6:
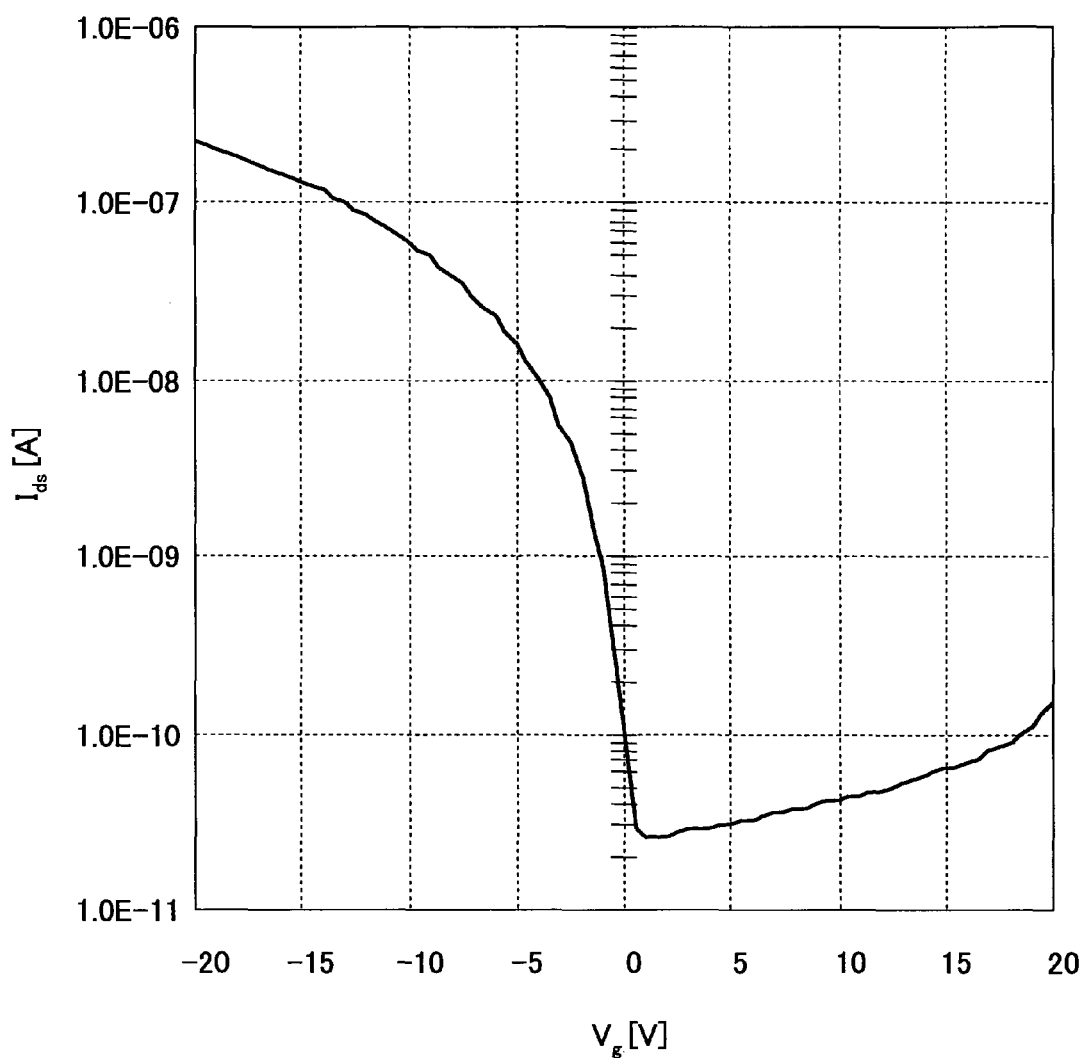
FIG. 6 shows a graph illustrating static performance of the organic transistor of the example 1.

FIG. 6 shows a graph illustrating static performance of the organic transistor of the example 1.

As shown in FIG. 6, an ON-state current is $2.2 \times 10^{-7}$ A ($V_g = -20$ V), an OFF-state current is $1.0 \times 10^{-10}$ A ($V_g = 0$ V). That is to say, the ratio of the ON-state current to the OFF-state current is $2.2 \times 10^3$. This result indicates that good static transistor performance is obtained.

Figure 7:
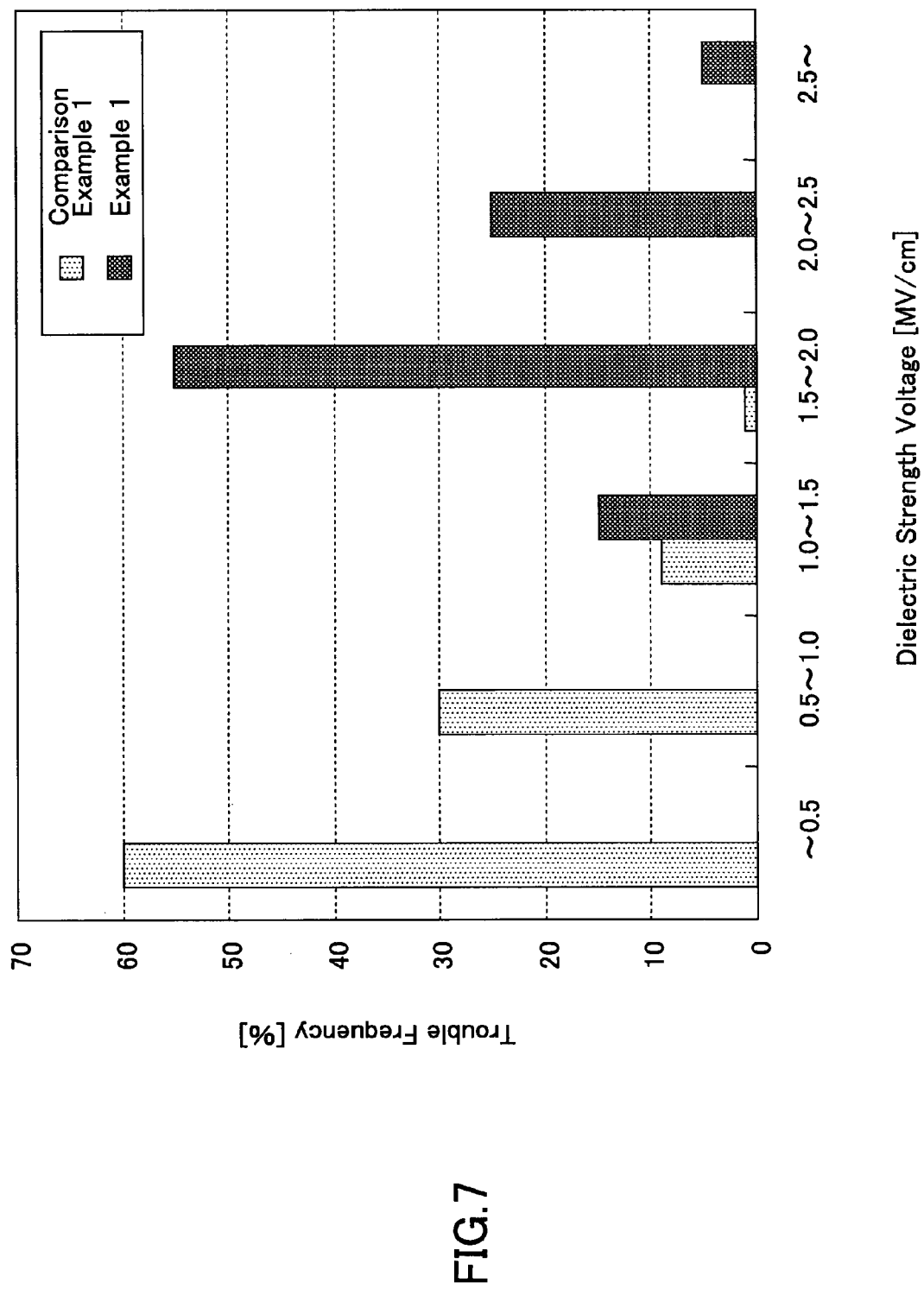
FIG. 7 is a bar chart showing defect distribution of a gate insulating film (insulation defect distribution)

FIG. 7 is a bar chart showing defect distribution of a gate insulting film (insulation defect distribution).

FIG. 7 reveals that the organic transistor of the example 1 has fewer insulation defects than the organic transistor of the comparison example 1. Particularly, the number of initial defects of the gate insulting film is reduced.

Next, dynamic performance of the organic transistors of the example 1 and the comparison example 1 is evaluated by using a pulse generator and an oscilloscope. When evaluating the dynamic performance of the organic transistors, a drain voltage $V_{ds}=-5V$ is applied, and a rectangular waveform (0 V to −5 V) having a duty ratio of 50% is supplied as the gate voltage $V_g$.

Figure 8:
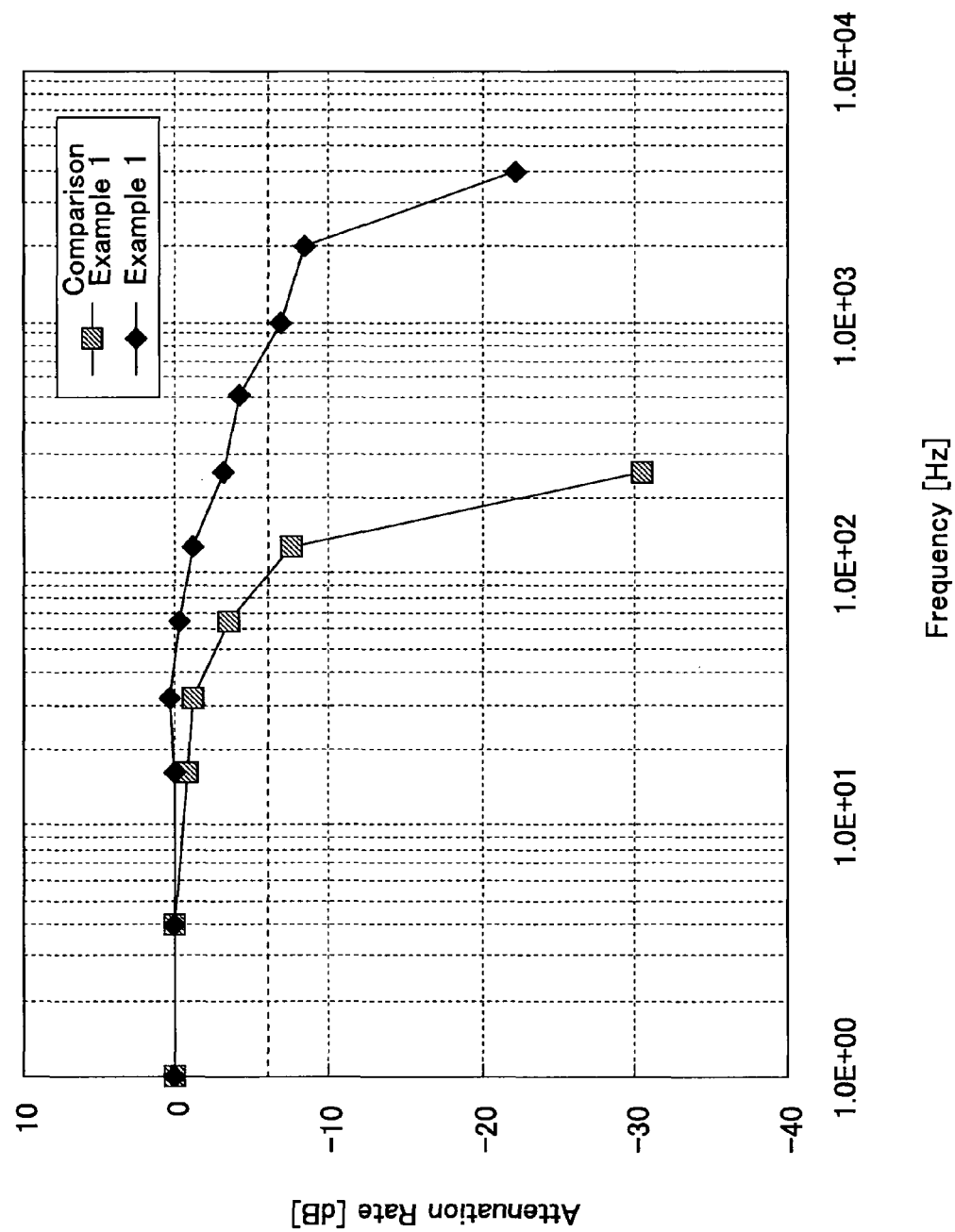
FIG. 8 shows graphs illustrating dynamic performance of the organic transistors of the example 1 and the comparison example 1.

FIG. 8 shows graphs illustrating dynamic performance of the organic transistors of the example 1 and the comparison example 1.

FIG. 8 reveals that the cutoff frequency of the organic transistor of the example 1 is 900 Hz. In comparison, the cutoff frequency of the organic transistor of the comparison example 1 is 100 Hz. This result indicates that good dynamic transistor performance is obtained.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Application No. 2006-213405 filed on Aug. 4, 2006, the entire contents of which are hereby incorporated by reference.

The invention claimed is:

1. An organic transistor, comprising:
a gate electrode;
a gate insulting film;
a source electrode;
a drain electrode; and
an organic semiconductor layer formed of an organic semiconductor material, wherein the gate electrode, the gate insulting film, the source electrode, the drain electrode, and the organic semiconductor layer are formed on a substrate, at least one of the source electrode and the drain electrode has an opening, and the opening is enclosed within the at least one of the source electrode and the drain electrode having the opening.

2. The organic transistor as claimed in claim 1, wherein the source electrode and the drain electrode are formed on the gate insulting film, and a bottom surface of the opening is a surface of the gate insulting film.

3. The organic transistor as claimed in claim 1, wherein the source electrode and the drain electrode are formed on the gate insulting film, and the organic semiconductor layer is formed by a printing step on the gate insulting film in a region including a portion of the opening.

4. The organic transistor as claimed in claim 3, wherein the printing step includes one of inkjet printing and dispensing.

5. The organic transistor as claimed in claim 1, wherein the organic semiconductor material is soluble to an organic solvent.

6. The organic transistor as claimed in claim 1, wherein the source electrode and the drain electrode are formed in a region of the gate insulting film having increased surface energy.

7. The organic transistor as claimed in claim 6, wherein the surface energy of the gate insulting film is increased by irradiation of ultra-violet rays.

8. The organic transistor as claimed in claim 1, wherein the gate insulting film includes a polymer material.

9. The organic transistor as claimed in claim 8, wherein the polymer material includes polyimide.

10. The organic transistor according to claim 1, wherein only a part of the organic semiconductor layer is formed in the opening.

11. An active matrix display, comprising:
one or more organic transistors; wherein
each of the organic transistors includes
a gate electrode;
a gate insulting film;
a source electrode;
a drain electrode; and
an organic semiconductor layer formed from an organic semiconductor material, wherein the gate electrode, the gate insulting film, the source electrode, the drain electrode, and the organic semiconductor layer are formed on a substrate, at least one of the source electrode and the drain electrode has an opening, and the opening is enclosed within the at least one of the source electrode and the drain electrode having the opening.

* * * * *